(12) United States Patent
Alpert et al.

(10) Patent No.: US 8,601,425 B2
(45) Date of Patent: Dec. 3, 2013

(54) SOLVING CONGESTION USING NET GROUPING

(75) Inventors: Charles Jay Alpert, Austin, TX (US); Zhuo Li, Austin, TX (US); Chin Ngai Sze, Austin, TX (US); Yaoguang Wei, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/445,128

(22) Filed: Apr. 12, 2012

(65) Prior Publication Data

US 2013/0275934 A1 Oct. 17, 2013

(51) Int. Cl.
*G06F 17/50* (2006.01)

(52) U.S. Cl.
USPC .......................................... 716/129; 716/126

(58) Field of Classification Search
USPC .................................................. 716/126, 129
See application file for complete search history.

(56) References Cited

U.S. PATENT DOCUMENTS

| | | | |
|---|---|---|---|
| 6,175,950 B1 | 1/2001 | Scepanovic et al. | |
| 6,253,363 B1 | 6/2001 | Gasanov et al. | |
| 6,260,183 B1 | 7/2001 | Raspopovic et al. | |
| 6,289,495 B1 | 9/2001 | Raspopovic et al. | |
| 6,401,234 B1 * | 6/2002 | Alpert et al. | 716/129 |
| 6,430,734 B1 * | 8/2002 | Zahar | 716/127 |
| 6,438,736 B1 * | 8/2002 | Zahar | 716/129 |
| 7,096,448 B2 | 8/2006 | Teig et al. | |
| 7,222,322 B1 * | 5/2007 | Chyan et al. | 716/122 |
| 7,299,442 B2 | 11/2007 | Alpert et al. | |
| 7,752,590 B1 * | 7/2010 | Chyan et al. | 716/122 |
| 7,966,597 B2 * | 6/2011 | Daellenbach | 716/129 |
| 8,065,652 B1 * | 11/2011 | Salowe et al. | 716/139 |
| 8,112,733 B2 | 2/2012 | Frankle et al. | |
| 8,239,797 B1 * | 8/2012 | Ghosh et al. | 716/110 |
| 8,250,514 B1 * | 8/2012 | Wadland et al. | 716/131 |
| 8,341,586 B2 * | 12/2012 | Frankle et al. | 716/126 |
| 8,356,267 B2 * | 1/2013 | Agarwal et al. | 716/126 |
| 8,375,348 B1 * | 2/2013 | Raj et al. | 716/126 |
| 2001/0003843 A1 | 6/2001 | Scepanovic et al. | |
| 2006/0156266 A1 * | 7/2006 | Alpert et al. | 716/13 |
| 2007/0256045 A1 * | 11/2007 | Lin et al. | 716/13 |
| 2009/0193379 A1 * | 7/2009 | McElvain et al. | 716/12 |
| 2010/0050143 A1 * | 2/2010 | Frankle et al. | 716/8 |
| 2011/0055784 A1 * | 3/2011 | Gao et al. | 716/125 |
| 2011/0214100 A1 * | 9/2011 | McElvain | 716/130 |
| 2012/0110536 A1 * | 5/2012 | Agarwal et al. | 716/129 |
| 2012/0174052 A1 * | 7/2012 | Mathur | 716/129 |
| 2013/0086534 A1 * | 4/2013 | Zhao et al. | 716/50 |
| 2013/0086544 A1 * | 4/2013 | Alpert et al. | 716/129 |
| 2013/0086545 A1 * | 4/2013 | Alpert et al. | 716/129 |

OTHER PUBLICATIONS

Y.-J. Chang et al. NTHU-Route 2.0: A fast and stable global router. In Proc. ICCAD, pp. 338-343, 2008.
H.-Y. Chen et al. High-performance global routing with fast overflow reduction. In Proc. ASPDAC, pp. 582-587, 2009.
C. Minsik et al. BoxRouter 2.0: Architecture and implementation of a hybrid and robust global router. In Proc. ICCAD, pp. 503-508, 2007.
Y. Xu et al. FastRoute 4.0: Global router with efficient via minimization. In Proc. ASPDAC, pp. 576-581, 2009.
M. D. Moffitt. MaizeRouter: Engineering an effective global router. IEEE Trans. on CAD, 27(11):2017-2026, 2008.

\* cited by examiner

*Primary Examiner* — Stacy Whitmore
(74) *Attorney, Agent, or Firm* — Garg Law Firm, PLLC; Rakesh Garg; John Flynn

(57) ABSTRACT

A method, system, and computer program product for solving a congestion problem in an integrated circuit (IC) design are provided in the illustrative embodiments. A congested g-edge is selected from a set of congested g-edges. A set of congesting nets is selected, wherein the set of congesting nets cause congestion in the selected congested g-edges by crossing the selected congested g-edge. A vacancy data structure corresponding to the selected congested g-edge is populated. A subset of the set of the congesting nets is selected. The subset of the set of the congesting nets is rerouted to a candidate g-edge identified in the vacancy data structure.

20 Claims, 5 Drawing Sheets

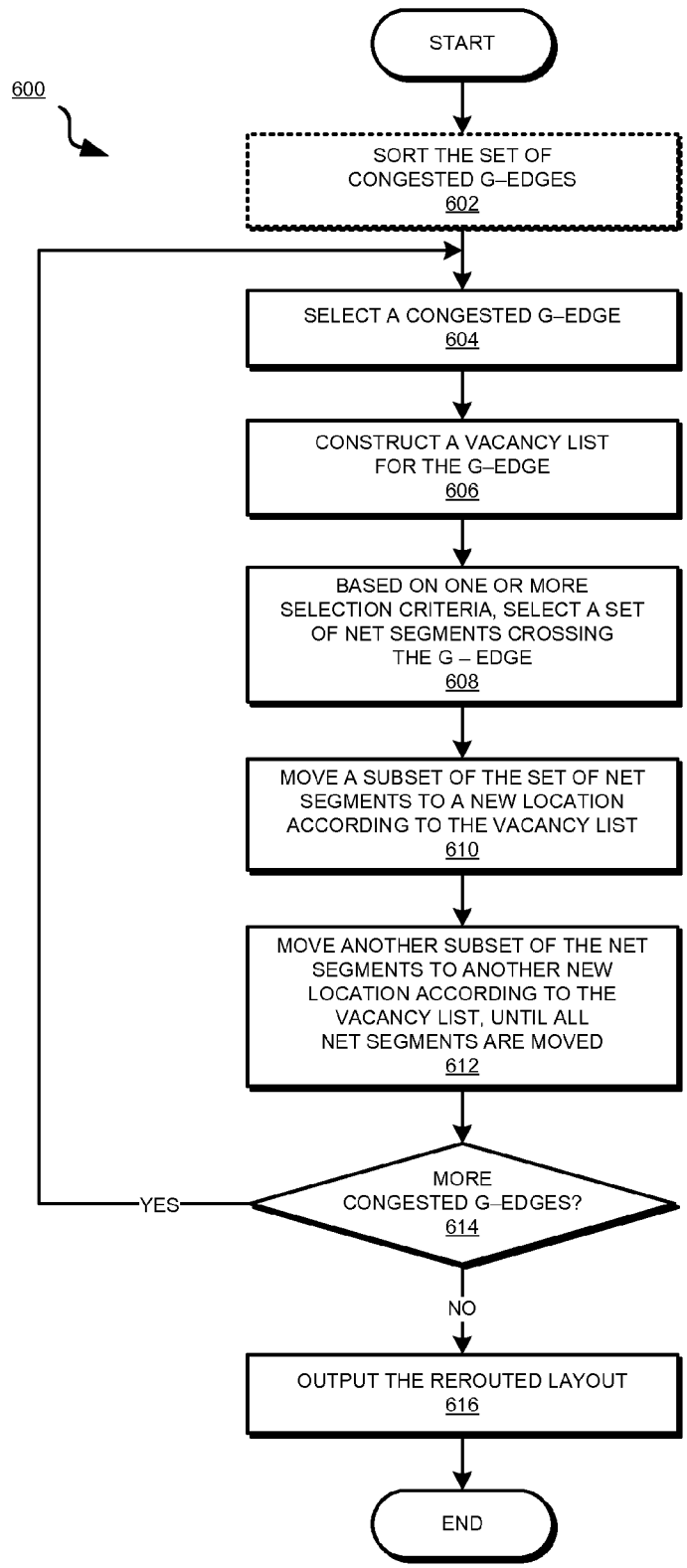

SOLVING CONGESTION USING NET GROUPING

BACKGROUND

1. Technical Field

The present invention relates generally to a method, system, and computer program product for designing an integrated circuit (IC). More particularly, the present invention relates to a method, system, and computer program product for solving congestion problems in an IC design using net grouping.

2. Description of the Related Art

Modern day electronics include components that use ICs. ICs are electronic circuits formed using Silicon as a substrate and by adding impurities to form solid-state electronic devices, such as transistors, diodes, and resistors. Commonly known as a "chip," an IC is generally encased in hard plastic. The components in modern day electronics generally appear to be rectangular black plastic pellets with connector pins protruding from the plastic encasement.

Circuit designers use a variety of software tools to design electronic circuits that accomplish an intended task. For example, a digital circuit may be designed to accept digital inputs, perform some computation, and produce a digital output. An analog circuit may be designed to accept analog signals, manipulate the analog signals, such as my amplifying, filtering, or mixing the signals, and produce an analog or digital output. Generally, any type of circuit can be designed as an IC.

Logical synthesis, physical synthesis, and generation of a routed and timing-closed design are some of the functions of an IC design software tool. Logical synthesis is the process of designing the logical operation that is to be achieved by a circuit. Physical synthesis is the mapping, translating, or integration of that logical synthesis to the physical design components, such as logic gate and buffer circuits. Routing and timing-closed design is the design produced by adjusting the wire routings and component placements in a design so that the design meets certain design criteria such as delay or slew of signals, or wirelength restrictions.

The software tools used for designing ICs produce, manipulate, or otherwise work with the circuit layout at very small scales. Some of the components that such a tool may manipulate may only measure tens of nanometer across when formed in Silicon. The designs produced and manipulated using these software tools are complex, often including millions of such components interconnected to form an intended electronic circuitry.

The interconnects between components are called wires. A wire is a connection between parts of electronic components, and is formed using a metallic material or others such as fiber optics and carbon nanotubes that conducts electricity. A net is a collection of interconnections among a group of components. A wire forms a segment of a net, such as a connection between two components.

The software tools manipulate these components at the components level, or blocks of components level. A block of components is also known as a global cell, or g-cell. A g-cell in an IC design is a portion of the IC design. One way of identifying g-cells in an IC design is to overlay a grid of imaginary vertical and horizontal lines on the design, and deeming each portion of the IC design bound by horizontal and vertical lines as a g-cell. The horizontal or vertical lines bounding a g-cell are called cut-lines. A g-cell is also known as a tile. The boundary between two g-cells is known as a g-edge.

Imposing such a grid on an IC design abstracts the global routing problem away from the actual wire implementation and gives a more mathematical representation of the task. A net may span one or more g-cells and may cross several cut lines (i.e., g-edges).

An IC design software tool can, among other functions, manipulate cells, or interconnect components of one cell with components of other cells, such as to form nets. These cells are different from g-cells in that these cells are the actual logic components, such as the semiconductor gates.

Placement problem is the problem of placing the cells of a chip such that the design meets all the design parameters of the chip. Routing is the process of connecting the pins after placement. In other words, placement results in a rendering of the components of various cells as being located in certain positions in the design, whereas routing results in a rendering of how the metal layers would be populated with that placement.

A wire can be designed to take any one of the several available paths in a design. Placement of a wire on a certain path, or track, is a part of routing.

A router is a component of an IC design tool that performs the routing function. Once the placement component—known as a placer—has performed the placement function, the router attempts to connect the wires without causing congestion. For example, if a design parameter calls for no more than five wires in a given area, the router attempts to honor that restriction in configuring the wiring. Such limitations on the wiring are a type of design constraints and are called congestion constraints. Other types of design constraints may include, for example, blocked areas or blockages—cell areas where wires may not be routed.

A global router divides the routing region into g-cells and attempts to route nets through the g-cells such that no g-edge overflows its capacity. Global routing is the process of connecting a g-cell to other g-cells.

After global routing, wires must be assigned to actual tracks within each tile, followed by detail routing, which must connect each global route to the actual pin shape on the cell. Another type of router—known as the detailed router—performs the detailed routing. The global and detailed routing produced during the design process is collectively referred to as "routing" and is usually further modified during optimization of the design.

SUMMARY

The illustrative embodiments provide a method, system, and computer program product for solving a congestion problem in an integrated circuit design using net grouping. An embodiment selects, using an application executing using a processor and a memory in a data processing system, a congested g-edge from a set of congested g-edges. The embodiment selects a set of congesting nets, wherein the set of congesting nets cause congestion in the selected congested g-edges by crossing the selected congested g-edge. The embodiment populates a vacancy data structure corresponding to the selected congested g-edge. The embodiment selects a subset of the set of the congesting nets. The embodiment reroutes the subset of the set of the congesting nets to a candidate g-edge identified in the vacancy data structure.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 6 depicts a flowchart of an example process of solving a congestion problem using net grouping and information sharing in accordance with an illustrative embodiment.

DETAILED DESCRIPTION

Figure 1:
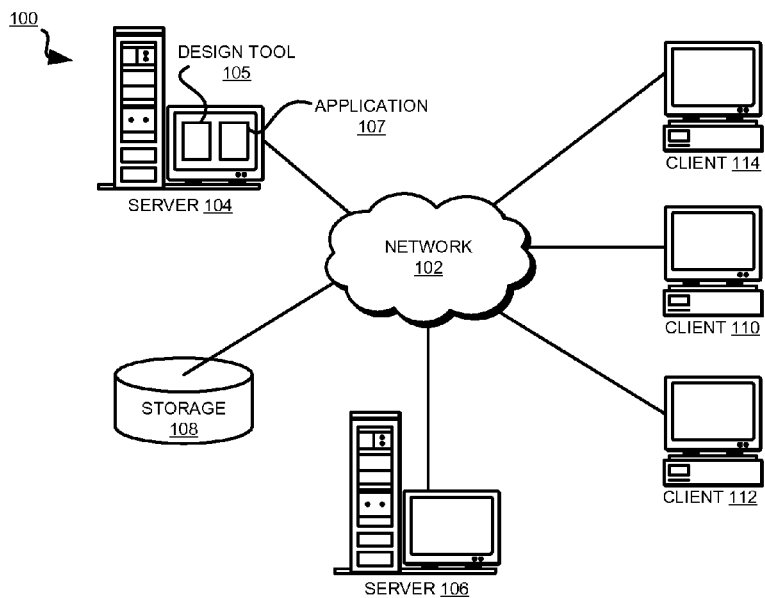
FIG. 1 depicts a pictorial representation of a network of data processing systems in which illustrative embodiments may be implemented.

IC design tools typically include or interact with a routing tool that performs the routing step of the design. The routing tool routes the nets and resolves any congestion that exceeds a congestion threshold.

A congestion problem is a routing problem where the routing results in more nets crossing a g-edge than that the g-edge's capacity. For example, a g-edge may have 30 tracks to route wires, and therefore a capacity of 30 wires. Of the capacity of 30, as an example, 10 tracks may have blockages that are not movable. Consequently, the g-edge has a true capacity of 20 wires (30 minus 10). If a routing solution causes 25 wires to cross the g-edge, the g-edge is congested.

The illustrative embodiments recognize that solving a congestion problem is time consuming and computationally expensive. The illustrative embodiments further recognize that the present methods for solving a congestion problem are wasteful of computing resources for at least two reasons—first, even if the congestion problem requires rerouting of several nets away from a congested g-edge, the present methods attempt to reroute the excess nets one net at a time. Second, the present methods do not leverage the computations performed in rerouting one net for reducing the computation load of rerouting another net.

The illustrative embodiments used to describe the invention generally address and solve the above-described problems and other problems related to solving congestion problems in routing an IC design layout. The illustrative embodiments provide a method, system, and computer program product for solving congestion problems in an IC design using net grouping and information sharing.

While some embodiments are described with respect to certain numbers of nets and g-edges, an implementation may use an embodiment to solve for any number of nets and g-edges without departing the scope of the invention. For example, an implementation of an embodiment may route a set of all nets that exceed a g-edge's capacity together or in smaller subsets without departing the scope of the invention. As another example, an implementation of an embodiment can consider not just one g-edge of one g-cell in the manner described herein, but additional g-edges of additional g-cells that a net segment may be passing through, because congestion generally affects contiguous g-cells, within the scope of the illustrative embodiments.

The illustrative embodiments are described with respect to certain ICs or circuits only as examples. Such descriptions are not intended to be limiting on the invention. For example, an illustrative embodiment described with respect to a microprocessor design can be implemented with respect to a design of a memory whose placement can be made MPL-aware by using an embodiment.

The illustrative embodiments are described with respect to certain data, data structures, file-systems, file names, directories, and paths only as examples. Such descriptions are not intended to be limiting on the invention. For example, an illustrative embodiment described with respect to a local application name and path can be implemented as an application on a remote path within the scope of the invention. As another example, an embodiment described using a table can be implemented using another data structure within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention.

The illustrative embodiments are described using specific code, designs, architectures, layouts, schematics, and tools only as examples and are not limiting on the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. An illustrative embodiment may be implemented in hardware, software, or a combination thereof.

The examples in this disclosure are used only for the clarity of the description and are not limiting on the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

Figure 2:
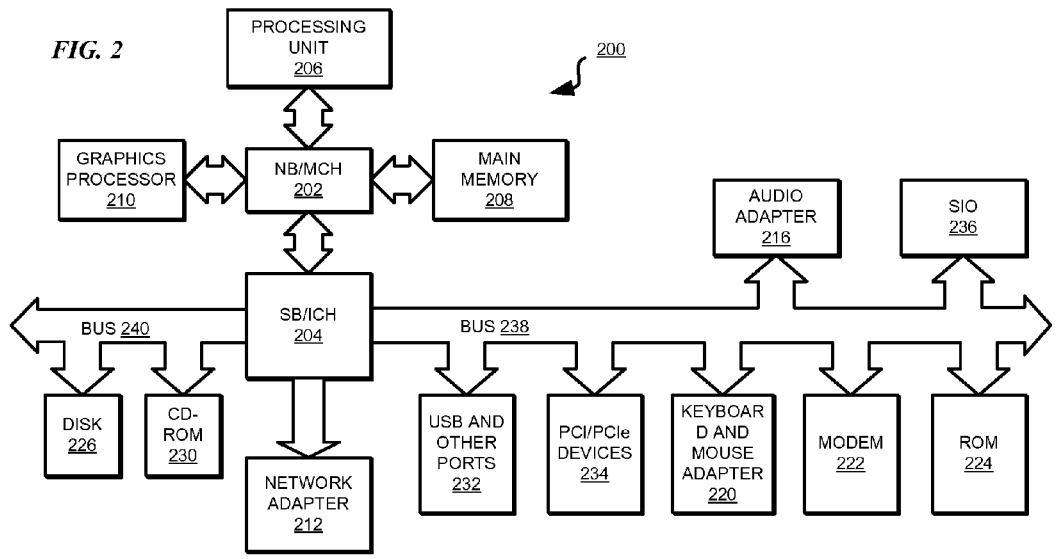
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a pictorial representation of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables. Server 104 and server 106 couple to network 102 along with storage unit 108. Software applications may execute on any computer in data processing environment 100.

In addition, clients 110, 112, and 114 couple to network 102. A data processing system, such as server 104 or 106, or client 110, 112, or 114 may contain data and may have software applications or software tools executing thereon.

Any data processing system, such as server 104, may include design tool 105 that may be improved using an embodiment. Design tool 105 may be any suitable software application for designing ICs. Application 107 may be any combination of hardware and software usable for implementing an embodiment of the invention such that the embodiment is usable with design tool 105 for solving congestion problems using net grouping and information sharing.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as server 104 or client 110 in FIG. 1, in which computer usable program code or instructions implementing the processes of the illustrative embodiments may be located for the illustrative embodiments.

In the depicted example, data processing system 200 employs a hub architecture including North Bridge and memory controller hub (NB/MCH) 202 and south bridge and input/output (I/O) controller hub (SB/ICH) 204. Processing unit 206, main memory 208, and graphics processor 210 are coupled to north bridge and memory controller hub (NB/MCH) 202. Processing unit 206 may contain one or more processors and may be implemented using one or more heterogeneous processor systems. Graphics processor 210 may be coupled to the NB/MCH through an accelerated graphics port (AGP) in certain implementations.

In the depicted example, local area network (LAN) adapter 212 is coupled to south bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to south bridge and I/O controller hub 204 through bus 238. Hard disk drive (HDD) 226 and CD-ROM 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE) or serial advanced technology attachment (SATA) interface. A super I/O (SIO) device 236 may be coupled to south bridge and I/O controller hub (SB/ICH) 204.

An operating system runs on processing unit 206. The operating system coordinates and provides control of various components within data processing system 200 in FIG. 2. The operating system may be a commercially available operating system such as Microsoft® Windows® (Microsoft and Windows are trademarks of Microsoft Corporation in the United States, other countries, or both), or Linux® (Linux is a trademark of Linus Torvalds in the United States, other countries, or both). An object oriented programming system, such as the Java™ programming system, may run in conjunction with the operating system and provides calls to the operating system from Java™ programs or applications executing on data processing system 200 (Java and all Java-based trademarks and logos are trademarks or registered trademarks of Oracle and/or its affiliates).

Program instructions for the operating system, the object-oriented programming system, the processes of the illustrative embodiments, and applications or programs are located on storage devices, such as hard disk drive 226, and may be loaded into a memory, such as, for example, main memory 208, read only memory 224, or one or more peripheral devices, for execution by processing unit 206. Program instructions may also be stored permanently in non-volatile memory and either loaded from there or executed in place. For example, the synthesized program according to an embodiment can be stored in non-volatile memory and loaded from there into DRAM.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in north bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a PDA.

Figure 3:
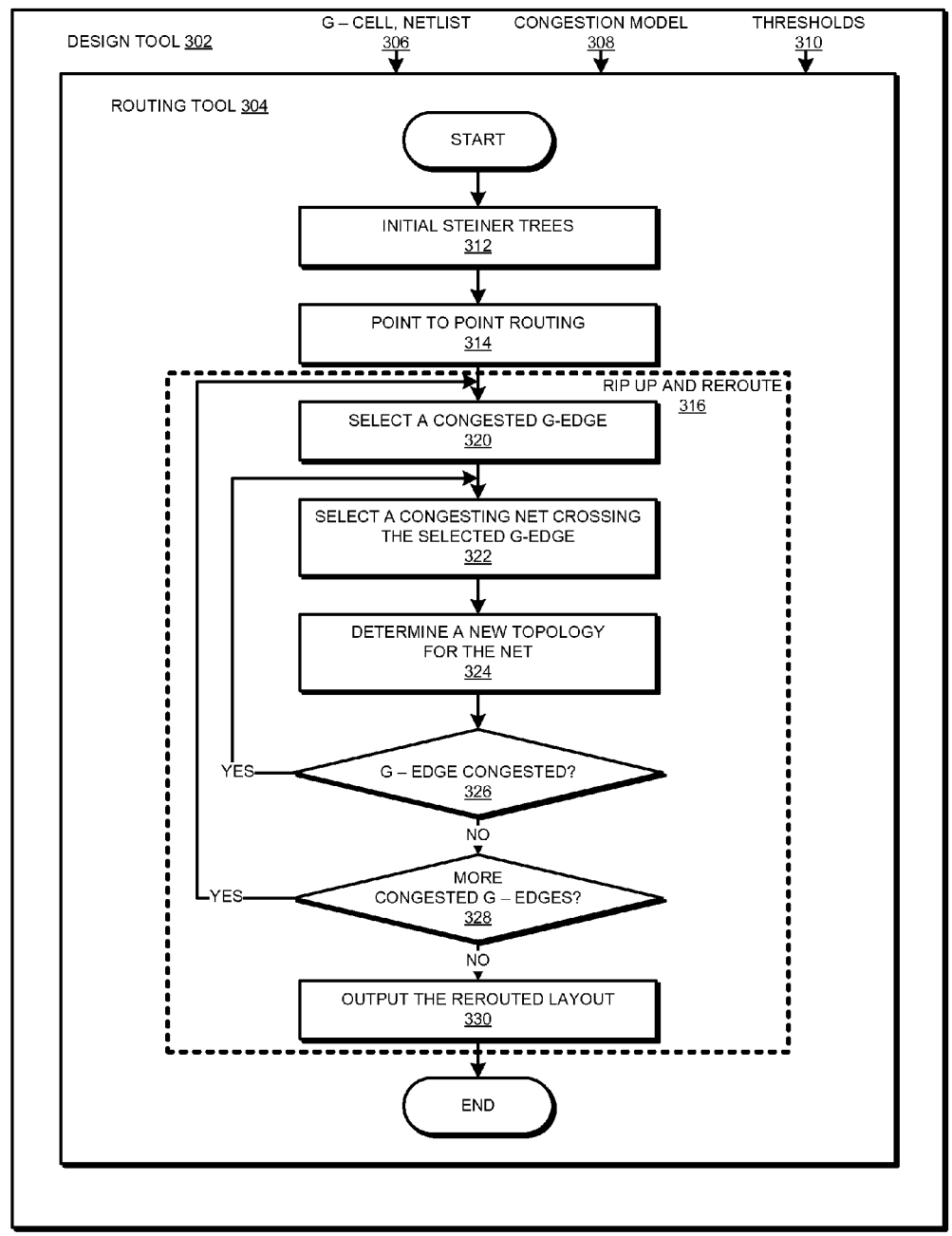
FIG. 3 depicts a block diagram of an example rip up and rerouting process that can be improved using an illustrative embodiment.

With reference to FIG. 3, this figure depicts a block diagram of an example rip up and rerouting process that can be improved using an illustrative embodiment. Design tool 302 is analogous to design tool 105 in FIG. 1. Routing tool 304 is an example existing routing tool that can be improved to solve congestion problems using net grouping and information sharing according to an embodiment.

Routing tool 304 either computes certain aspects of an IC design, or receives those aspects from design tool 302 in the form of inputs. G-cells and netlist 306 provides routing tool 304 the information about the IC design layout that routing tool 304 needs to perform the routing. Congestion model 308 provides routing tool 304 information about g-edge capacities, wiring demand, and blockage information. Wiring demand of a g-edge is a measure of existing congestion in the g-edge by accounting for the capacity, the blockages, and the true capacity of the g-edge.

Thresholds 310 can be any set of numbers and type of thresholds suitable for a given implementation. For example, in one embodiment, thresholds 310 include a congestion threshold for each g-edge and a wirelength bound for each net. A congestion threshold is a limit on how congested a g-edge is allowed to become in an acceptable routing solution. For example, an IC design specification may require that no g-edge in a region of the design be congested more than ninety percent for the routed design to be acceptable.

A wirelength bound is a limit on the length of a net or net segment. For example, in one embodiment, a wirelength bound may specify a scenic ratio constraint, which a critical net should not exceed in an acceptable routed design.

Presently, routing tool 304 delivers an acceptable routed IC design layout in three broad steps. Routing tool 304 constructs an initial Steiner tree for the given g-cells and nets (step 312). Routing tool 304 perform point-to-point routing for the nets (step 314). Routing tool performs rip up and reroute operations to solve any congestion problems (step 316).

As described earlier, prior art routing tool 304 disadvantageously performs step 316, one congesting net at a time, searching the complete set of potential rerouting solutions for rerouting each congesting net. Presently, routing tool 304 selects a congested g-edge (step 320). Routing tool 304 select a congesting net crossing the selected g-edge (step 322).

Routing tool 304 determines a new topology for the congesting net, to wit, finds a new location for placing the congesting segment of the net, (step 324). Prior art routing tool 304 does not reuse any subset of the new wire segments found during a previous iteration of finding a new topology for another congesting net. Accordingly, in determining the new topology of step 324 for a particular congesting net, routing tool 304 performs the determination anew for the congesting net, without the benefit of any similar computations routing tool 304 may have previously performed for another congesting net.

Routing tool 304 determines whether the g-edge remains congested after rerouting the selected congesting net (step 326). If the g-edge remains congested, to wit, if more congesting nets crossing the g-edge have to be rerouted ("Yes" path of step 326, routing tool returns to step 322 and selects another congesting net for rip up and reroute step 316.

If the selected g-edge is no longer congested, to wit, all congesting nets have been ripped up and rerouted to other g-edges ("No" path of step 326), routing tool 304 determines whether more congested g-edges remain to be solved in this manner (step 328). If more congested g-edges remain ("Yes" path of step 328), routing tool 304 returns to step 320 and selects another congested g-edge to solve for congestion in this manner.

If no more congested g-edges remain ("No" path of step 328), routing tool 304 outputs the rerouted IC design layout (step 330). Thus, as the illustrative embodiments recognize and solve, prior art routing tool 304 incurs unnecessary computations in generating the rerouted layout that meets the congestion threshold, wirelength bound, and other constraints on the acceptability of the IC design layout.

Figure 4:
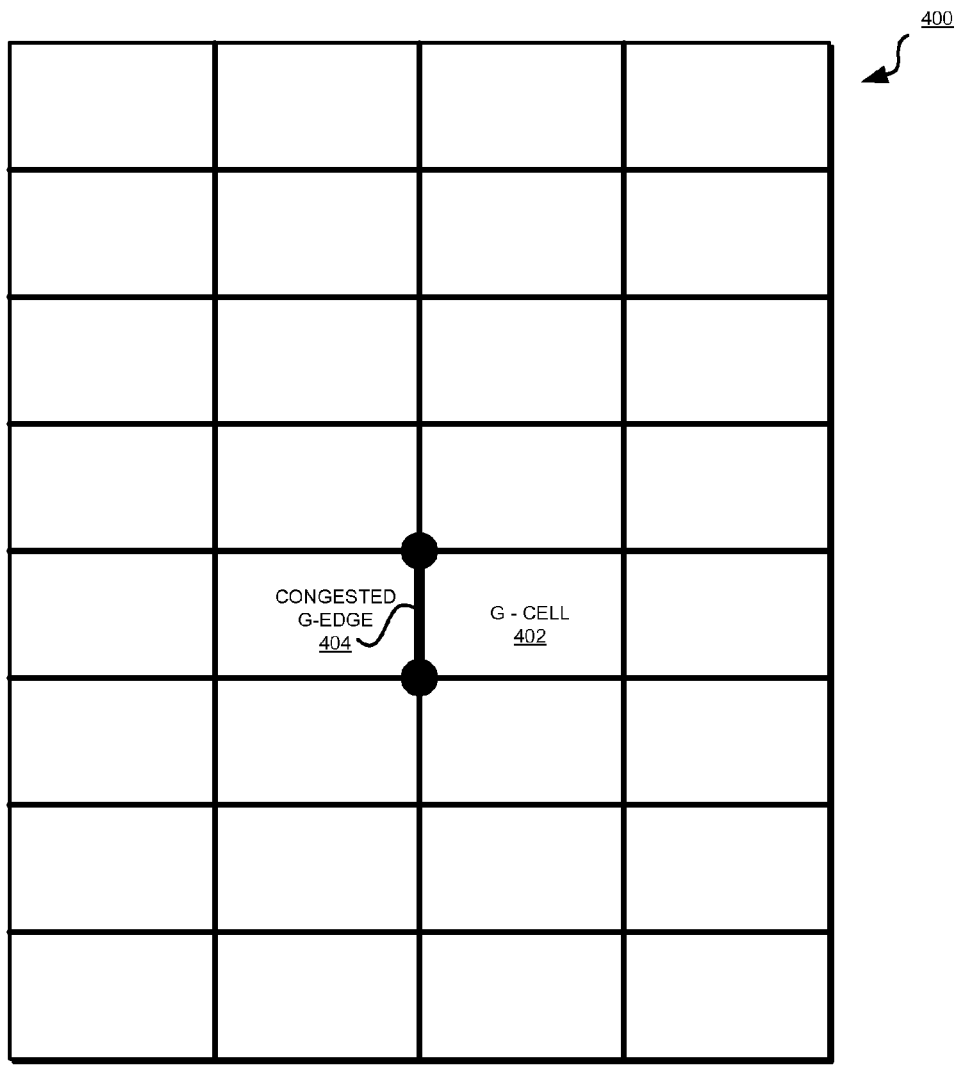
FIG. 4 depicts a block diagram of an IC design layout in which congestion can be removed in accordance with an illustrative embodiment.

With reference to FIG. 4, this figure depicts a block diagram of an IC design layout in which congestion can be removed in accordance with an illustrative embodiment. Layout 400 includes several blocks as show, each of which is a g-cell. Routing tool 304 uses layout 400, such as a part of input 306, to produce the rerouted layout of step 330 in FIG. 3.

G-edge 404 is an example g-edge that is congested. For example, g-edge 404 may have a capacity of 10 tracks, six of which have blockages, leaving a true capacity of four for g-edge 404. As an example, consider that seven nets (not shown) cross g-edge 404. In this example, assuming a congestion ratio of one hundred percent being acceptable, at least three nets out of the seven nets have to be rerouted. To other g-edges in layout 400.

Figure 5:
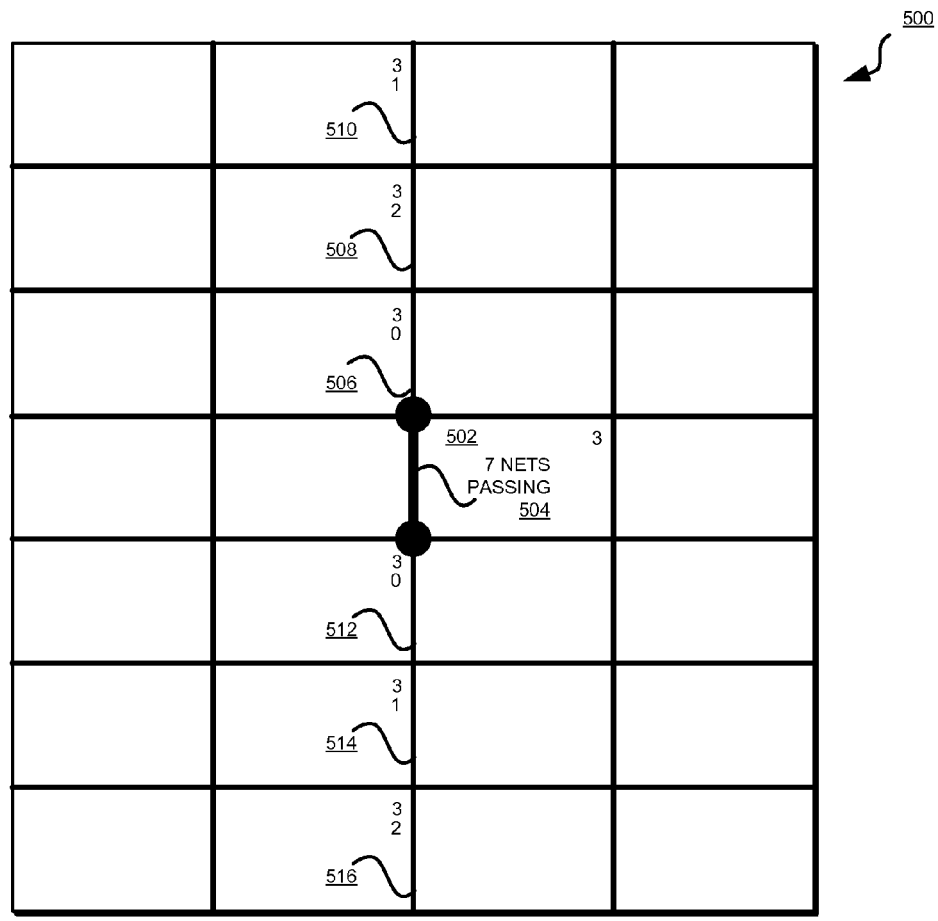
FIG. 5 depicts a block diagram of a configuration for solving a congestion problem using net groupings and information sharing in accordance with an illustrative embodiment.

With reference to FIG. 5, this figure depicts a block diagram of a configuration for solving a congestion problem using net groupings and information sharing in accordance with an illustrative embodiment. Layout 500 is analogous to layout 400 in FIG. 4. G-cell 502 is similar to g-cell 402, and g-edge 504 is similar to g-edge 404 in FIG. 4, respectively. As in the example used to describe FIG. 4, seven nets cross g-edge 504 causing a congestion by at least three nets (making at least three congesting nets), depending on the given congestion ratio.

Without implying a limitation thereto, an example manner of denoting a g-edge's true capacity and available empty tracks is shown in FIG. 5. G-edges are depicted in layout 500 with their true capacity noted as the top number in the top right corner of the g-cell on each g-edge's left side. Available number of empty tracks for a g-edge, where a congesting net from another g-edge can be rerouted, is shown as the second number below that top number. For example, g-edge 506 has a (true) capacity of three tracks, and none of the three tracks (0) is available for rerouting a congesting net's segment from another g-edge. Likewise, g-edge 508 has a true capacity of 3 with 2 available empty tracks; g-edge 510 has a true capacity of 3 with 1 available empty track; g-edge 512 has a true capacity of 3 with 0 available empty tracks; g-edge 514 has a true capacity of 3 with 1 available empty track; and g-edge 516 has a true capacity of 3 with 2 available empty tracks.

An improved routing tool according to an embodiment, such as routing tool 304 modified using an embodiment can use any of g-edges 506, 508, 510, 512, 514, or 516 for a modified rip up and rerouting of one or more of the congesting nets of g-edge 504. In performing the rip up and rerouting of the set of three congesting nets of g-edge 504, the improved routing tool reroutes groups or subsets of the congesting nets together. For example, in one embodiment, if g-edge 508 were to have three tracks available (as different from the depicted availability of 2), the improved routing tool would reroute the set of three congesting nets from g-edge 504 to g-edge 508 together. In another embodiment, according to the depicted availabilities in g-edges 508 and 514, the improved routing tool would reroute a subset of two out of the three congesting nets from g-edge 504 to g-edge 508 together, and reroute the remaining one congesting net in the set from g-edge 504 to g-edge 514.

Having located g-edge 504 as a congested edge, an embodiment performs an analysis of candidate g-edges where some or all of the congesting nets of g-edge 502 can be moved. The embodiment records the results of the analysis in vacancy table 520. In effect, vacancy table 520 is a view of the candidate g-edges, which allows the improved routing tool to analyze the vacancy information prior to actual rerouting, and organize the vacancy information such that the information is sharable for rerouting subsets of a set of congesting nets.

Vacancy table 520 uses columns 522-528 to store the available track information of g-edges neighboring g-edge 504, such as g-edges 506-516, indexed by distance from g-edge 504. As an example, vacancy table 520 stores index in column 522, distance from g-edge 504 in column 524, in North direction from g-edge 504 under column 526, and in South direction from g-edge 504 under column 528. Directions North and South are used in this example because edge 504 runs North-South and nets crossing edge 504 would have to be rerouted using a g-edge neighbor to the North or South.

In the depicted example, vacancy table 520 has no indexed entry at distance 1 because g-edges 506 and 512, which are at distance 1 from g-edge 504 to the North and to the South respectively, have zero availability and are not candidates for rerouting. At index 0, information about g-edges 508 and 514 is indicated, both of which are at distance 2 from g-edge 504. G-edge 508 at distance 2 has an availability of two to the North, and g-edge 514 at distance 2 has an availability of one to the South. Similarly, at index 1, information about g-edges 510 and 516 is indicated, both of which are at distance 3 from g-edge 504. G-edge 510 at distance 3 has an availability of one to the North, and g-edge 516 at distance 3 has an availability of two to the South.

Additional indices, such as 2, 3, 4, and so on, are not shown in column 522, but if present, would similarly show the information of the candidate g-edges farther than distance 3 to the North and to the South from g-edge 504. If a horizontal g-edge of g-cell 502 were the cause of congestion (not shown), vacancy information of g-edges to the East and West of that horizontal g-edge of g-cell 502 would be similarly depicted using a variation of vacancy table 520.

Vacancy table 520 is depicted as a table only as an example, without implying a limitation on the structure for storing similar information. An implementation can use any suitable data structure to store the vacancy information in the depicted manner or another similarly usable manner within the scope of the illustrative embodiments.

Once vacancy table 520 is constructed for a selected g-edge, such as g-edge 504, the improved routing tool need not spend computing resources for identifying candidate g-edges for rerouting congesting nets of g-edge 504, one congesting net at a time. With the benefit of vacancy table 520, the improved routing tool can identify a subset of congesting nets according to some common characteristic, such as a common difference between the net lengths and the wirelength bound of two congesting nets. Knowing the difference allows the improved routing tool to limit the rerouting options to only those candidate g-edges in vacancy table 520 that are distanced from g-edge 504 at most by that difference.

The improved routing tool can then select a suitable candidate g-edge and reroute the subset of congesting nets together instead of one at a time.

For the remaining congesting nets, the improved routing tool need not explore all neighboring g-edges for identifying candidate g-edges. Vacancy table 520 can be reused, to wit, the information in vacancy table 520 can be shared, for rerouting other congesting nets away from g-edge 504.

Thus, a routing tool improved with an embodiment can solve a congestion problem using net grouping and information sharing. At least for this reason, an improved routing tool according to an embodiment can solve the congestion problem in a more efficient manner as compared to the prior art routing tool.

With reference to FIG. 6, this figure depicts a flowchart of an example process of solving a congestion problem using net grouping and information sharing in accordance with an illustrative embodiment. Process 600 can be implemented as rip and reroute step 316 of routing tool 304 in FIG. 3. For example, process 600 can be implemented as application 107 in FIG. 1, and may execute in conjunction with design tool 105 (which in one embodiment includes routing tool 304 of FIG. 3) in FIG. 1.

Process 600 begins by selecting a congested g-edge from a layout (step 604). Optionally, before performing step 604, an embodiment of process 600 sorts an identified set of congested g-edges in the layout (step 602). In one embodiment, process 600 performs the selection of step 604 in the order of highest congestion to lowest congestion according to the sorting of optional step 602.

Process 600 constructs a vacancy list, such as vacancy list 520 in FIG. 5, for a selected g-edge that is causing the congestion (step 606). Based on one or more selection criteria, process 600 selects a set of nets whose segments are crossing the congested g-edge (step 608).

For example, out of the seven example nets crossing edge 504 in FIG. 5, process 600 may select those three to reroute whose net lengths are shorter than a wirelength bound by a threshold number of units. Selecting in this manner, process 600 can explore candidate g-edges farther from the congested g-edge of step 604.

The example criterion of the difference between a net length and wirelength bound is not intended to be a limitation on the criteria usable for selecting congesting nets that should be rerouted. Those of ordinary skill in the art will be able to select congesting nets for rerouting using other criteria, such as timing criticality, and such other criteria are contemplated within the scope of the illustrative embodiments.

Process 600 moves (reroutes) a subset of the set of nets selected in step 608 according to the vacancy table (step 610). In one embodiment, the subset includes all members of the set. In another embodiment, the subset includes some members of the set. If the subset moved in step 610 leaves some nets to be moved in the set, process 600 moves another subset of the set of congesting nets in a similar manner using the vacancy table until all nets in the set are moved (step 612).

Process 600 determines whether more congested g-edges remain to be solved in this manner (step 614). If more congested g-edges remain ("Yes" path of step 614), process 600 returns to step 604. If all congestion problems have been solved ("No" path of step 614), process 600 outputs the rerouted layout (step 616). Process 600 ends thereafter.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, a computer implemented method, system, and computer program product are provided in the illustrative embodiments for solving congestion problems using net grouping and information sharing. Using an embodiment, an improved routing tool can reroute congesting nets away from a congested g-edge in a more efficient manner as compared to the prior art routing tools. The candidate g-edges for rerouting are identified and cataloged in a vacancy data structure. The congesting nets are selected according to some criteria. A subset of the set of congesting nets is selected for rerouting according to certain criteria and rerouted to one or more of the candidate g-edges according to the vacancy data structure.

Furthermore, an embodiment can further improve the rerouting process by employing additional operations. For example, congestion usually afflicts contiguous g-cells. Therefore, an embodiment can move a congesting net segment to an empty track in a candidate g-edge, and then check to determine whether congestion exists in other adjacent g-edges. If the embodiment finds congestion in such adjacent g-edges, the embodiment can move the net segment to a farther candidate g-edge to alleviate congestion in the adjacent g-edges as well. For future movements of other congesting net segments, the embodiment can first check whether a g-edge adjacent to the congested g-edge along the edge axis is also has a congested edge. Using this information, the embodiment can choose to move the congesting net segment farther than the adjacent g-edge and avoid a contiguous congested region of the layout.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage device(s) or computer readable media having computer readable program code embodied thereon.

Any combination of one or more computer readable storage device(s) or computer readable media may be utilized. The computer readable medium may be a computer readable signal medium or a computer readable storage medium. A computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible device or medium that can contain, or store a program for use by or in connection with an instruction execution system, apparatus, or device.

Program code embodied on a computer readable storage device or computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to one or more processors of one or more general purpose computers, special purpose computers, or other programmable data processing apparatuses to produce a machine, such that the instructions, which execute via the one or more processors of the computers or other programmable data processing apparatuses, create means for implementing the functions/acts specified in the flowchart and/or block diagram block or blocks.

These computer program instructions may also be stored in one or more computer readable storage devices or computer readable media that can direct one or more computers, one or more other programmable data processing apparatuses, or one or more other devices to function in a particular manner, such that the instructions stored in the one or more computer readable storage devices or computer readable medium produce an article of manufacture including instructions which implement the function/act specified in the flowchart and/or block diagram block or blocks.

The computer program instructions may also be loaded onto one or more computers, one or more other programmable data processing apparatuses, or one or more other devices to cause a series of operational steps to be performed on the one or more computers, one or more other programmable data processing apparatuses, or one or more other devices to produce a computer implemented process such that the instructions which execute on the one or more computers, one or more other programmable data processing apparatuses, or one or more other devices provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer implemented method for solving a congestion problem in an integrated circuit (IC) design, the method comprising:
   selecting, using an application executing using a processor and a memory in a data processing system, a congested g-edge from a set of congested g-edges;
   selecting a set of congesting nets, wherein the set of congesting nets causes congestion in the selected congested g-edges by crossing the selected congested g-edge;
   populating a vacancy data structure corresponding to the selected congested g-edge, wherein the vacancy data structure stores available track information of a set of g-edges and wherein the information is indexed by a distance between the selected congested g-edge and g-edge in the set of g-edges;
   selecting a subset of the set of the congesting nets; and
   rerouting the subset of the set of the congesting nets to a candidate g-edge identified in the vacancy data structure.

2. The method of claim 1, wherein the rerouting the subset omits evaluating a possibility of moving a segment of a congesting net in the subset to a neighboring g-edge of the selected congested g-edge because the neighboring g-edge is not identified in the vacancy data structure, further comprising:
   rerouting a second subset of the set of the congesting nets to a second candidate g-edge identified in the vacancy data structure.

3. The method of claim 1, further comprising:
   determining whether a segment of a congesting net in the subset is causing congestion in a g-edge neighboring the selected congested g-edge; and
   skipping, responsive to the determining being affirmative, the g-edge neighboring the selected congested g-edge for the rerouting.

4. The method of claims 1, wherein the populating comprises:
   identifying, in the vacancy data structure, the candidate g-edge neighboring the selected congested g-edge such that a direction of the candidate g-edge relative to the selected congested g-edge corresponds to an orientation of the edge;
   recording in the vacancy data structure a distance between the candidate g-edge and the selected congested g-edge; and
   recording in the vacancy data structure a number of available empty tracks in the candidate g-edge.

5. The method of claim 1, further comprising:
   selecting the set of congesting nets from a set of nets crossing the edge of the selected congested g-edge, wherein the set of congesting nets is a subset of the set of nets, and wherein the selecting employs a selection criterion.

6. The method of claim 5, wherein the selection criterion for selecting the set of congesting nets causes that net in the set of nets to be selected as a congesting net whose net length is shorter than a wirelength bound by a threshold value.

7. The method of claim 1, further comprising:
   identifying the set of congested g-edges; and sorting the set of congested g-edges.

8. A computer usable program product comprising a computer usable storage device including computer usable code for solving a congestion problem in an integrated circuit (IC) design, the computer usable code comprising:
   computer usable code for selecting, using an application executing using a processor and a memory in a data processing system, a congested g-edge from a set of congested g-edges;
   computer usable code for selecting a set of congesting nets, wherein the set of congesting nets causes congestion in the selected congested g-edges by crossing the selected congested g-edge;
   computer usable code for populating a vacancy data structure corresponding to the selected congested g-edge, wherein the vacancy data structure stores available track information of a set of g-edges and wherein the information is indexed by a distance between the selected congested g-edge and g-edge in the set of g-edges;
   computer usable code for selecting a subset of the set of the congesting nets; and
   computer usable code for rerouting the subset of the set of the congesting nets to a candidate g-edge identified in the vacancy data structure.

9. The computer usable program product of claim 8, wherein the rerouting the subset omits evaluating a possibility of moving a segment of a congesting net in the subset to a neighboring g-edge of the selected congested g-edge because the neighboring g-edge is not identified in the vacancy data structure, further comprising:
   computer usable code for rerouting a second subset of the set of the congesting nets to a second candidate g-edge identified in the vacancy data structure.

10. The computer usable program product of claim 8, further comprising:
    computer usable code for determining whether a segment of a congesting net in the subset is causing congestion in a g-edge neighboring the selected congested g-edge; and
    computer usable code for skipping, responsive to the determining being affirmative, the g-edge neighboring the selected congested g-edge for the rerouting.

11. The computer usable program product of claims 8, wherein the populating comprises:
   computer usable code for identifying, in the vacancy data structure, the candidate g-edge neighboring the selected congested g-edge such that a direction of the candidate g-edge relative to the selected congested g-edge corresponds to an orientation of the edge;
   computer usable code for recording in the vacancy data structure a distance between the candidate g-edge and the selected congested g-edge; and
   computer usable code for recording in the vacancy data structure a number of available empty tracks in the candidate g-edge.

12. The computer usable program product of claim 8, further comprising:
   computer usable code for selecting the set of congesting nets from a set of nets crossing the edge of the selected congested g-edge, wherein the set of congesting nets is a subset of the set of nets, and wherein the selecting employs a selection criterion.

13. The computer usable program product of claim 12, wherein the selection criterion for selecting the set of congesting nets causes that net in the set of nets to be selected as a congesting net whose net length is shorter than a wirelength bound by a threshold value.

14. The computer usable program product of claim 8, further comprising:
   computer usable code for identifying the set of congested g-edges; and sorting the set of congested g-edges.

15. The computer usable program product of claim 8, wherein the computer usable code is stored in a computer readable storage medium in a data processing system, and wherein the computer usable code is transferred over a network from a remote data processing system.

16. The computer usable program product of claim 8, wherein the computer usable code is stored in a computer readable storage medium in a server data processing system, and wherein the computer usable code is downloaded over a network to a remote data processing system for use in a computer readable storage medium associated with the remote data processing system.

17. A data processing system for solving a congestion problem in an integrated circuit (IC) design, the data processing system comprising:
   a storage device including a storage medium, wherein the storage device stores computer usable program code; and
   a processor, wherein the processor executes the computer usable program code, and wherein the computer usable program code comprises:
   computer usable code for selecting, using an application executing using a processor and a memory in a data processing system, a congested g-edge from a set of congested g-edges;
   computer usable code for selecting a set of congesting nets, wherein the set of congesting nets causes congestion in the selected congested g-edges by crossing the selected congested g-edge;
   computer usable code for populating a vacancy data structure corresponding to the selected congested g-edge, wherein the vacancy data structure stores available track information of a set of g-edges and wherein the information is indexed by a distance between the selected congested g-edge and g-edge in the set of g-edges;
   computer usable code for selecting a subset of the set of the congesting nets; and
   computer usable code for rerouting the subset of the set of the congesting nets to a candidate g-edge identified in the vacancy data structure.

18. The data processing system of claim 17, wherein the rerouting the subset omits evaluating a possibility of moving a segment of a congesting net in the subset to a neighboring g-edge of the selected congested g-edge because the neighboring g-edge is not identified in the vacancy data structure, further comprising:
   computer usable code for rerouting a second subset of the set of the congesting nets to a second candidate g-edge identified in the vacancy data structure.

19. The data processing system of claim 17, further comprising:
   computer usable code for determining whether a segment of a congesting net in the subset is causing congestion in a g-edge neighboring the selected congested g-edge; and
   computer usable code for skipping, responsive to the determining being affirmative, the g-edge neighboring the selected congested g-edge for the rerouting.

20. The data processing system of claims 17, wherein the populating comprises:
   computer usable code for identifying, in the vacancy data structure, the candidate g-edge neighboring the selected congested g-edge such that a direction of the candidate g-edge relative to the selected congested g-edge corresponds to an orientation of the edge;
   computer usable code for recording in the vacancy data structure a distance between the candidate g-edge and the selected congested g-edge; and
   computer usable code for recording in the vacancy data structure a number of available empty tracks in the candidate g-edge.

* * * * *